US012628577B2

(12) United States Patent
Kang et al.

(10) Patent No.: US 12,628,577 B2
(45) Date of Patent: May 12, 2026

(54) METHOD FOR PREPARING TRANSITION METAL CHALCOGENIDE FILM AND ORGANOMETALIC PROMOTER AND FORMING THE SAME

(71) Applicant: KOREA ADVANCED INSTITUTE OF SCIENCE AND TECHNOLOGY, Daejeon (KR)

(72) Inventors: Kibum Kang, Daejeon (KR); Taesoo Kim, Daejeon (KR)

(73) Assignee: KOREA ADVANCED INSTITUTE OF SCIENCE AND TECHNOLOGY, Daejeon (KR)

(*) Notice: Subject to any disclaimer, the term of this patent is extended or adjusted under 35 U.S.C. 154(b) by 403 days.

(21) Appl. No.: 18/137,968

(22) Filed: Apr. 21, 2023

(65) Prior Publication Data

US 2023/0343590 A1 Oct. 26, 2023

(30) Foreign Application Priority Data

Apr. 26, 2022 (KR) ........................ 10-2022-0051290

(51) Int. Cl.

| | |
|---|---|
| ***H10P 14/20*** | (2026.01) |
| ***C23C 16/18*** | (2006.01) |
| ***H10P 14/24*** | (2026.01) |

(52) U.S. Cl.

CPC .......... *H10P 14/3436* (2026.01); *C23C 16/18* (2013.01); *H10P 14/24* (2026.01); *H10P 14/2908* (2026.01); *H10P 14/2921* (2026.01)

(58) Field of Classification Search

CPC ......... H01L 21/02568; H01L 21/02389; H01L 21/0262; H01L 21/0242; H01L 21/02595;

(Continued)

(56) References Cited

U.S. PATENT DOCUMENTS

| | | | | |
|---|---|---|---|---|
| 2007/0238607 A1* | 10/2007 | Alonso | .................. | B01J 27/051 423/414 |
| 2014/0027775 A1* | 1/2014 | Quick | .................. | C23C 16/305 257/53 |

(Continued)

FOREIGN PATENT DOCUMENTS

| | | | |
|---|---|---|---|
| KR | 10-2016-0124017 | 10/2016 | |
| KR | 10-1742388 | 5/2017 | |
| KR | 20200133508 | * 11/2020 | ............. C30B 29/46 |

OTHER PUBLICATIONS

Peng Wang, Jiayu Lei, Jiafan Qu, Shengyong Cao, Hu Jiang, Mengci He, Hongyan Shi, Xiudong Sun, Bo Gao, and Wenjun Liu§ (Mechanism of Alkali Metal Compound-Promoted Growth of Monolayer MoS2: Eutectic Intermediates, Chem. Mater, 2019, 31, 873-880). (Year: 2019).*

(Continued)

*Primary Examiner* — Didarul A Mazumder

(57) ABSTRACT

Provided is a method for preparing a transition metal chalcogenide film, which includes: a step of injecting a precursor for preparing a transition metal chalcogenide and an organometallic promoter into a chamber equipped with a substrate; and a step of forming a transition metal chalcogenide film on the substrate through a chemical reaction between the precursor for preparing a transition metal chalcogenide and the organometallic promoter.

14 Claims, 7 Drawing Sheets

(58) Field of Classification Search
CPC .................. C23C 16/18; C23C 16/305; C23C 16/4488; C30B 29/46
USPC .......................................................... 438/478
See application file for complete search history.

(56) References Cited

U.S. PATENT DOCUMENTS

2016/0308006 A1 10/2016 Park et al.
2016/0314968 A1* 10/2016 Kim .................. H01L 21/02381

OTHER PUBLICATIONS

HoKwon Kim et al., "Suppressing Nucleation in Metal-Organic Chemical Vapor Deposition of MoS2 Monolayers by Alkali Metal Halides", Nano Letters, vol. 17, pp. 5056-5063, 2017.
Pengfei Yang et al., "Batch production of 6-inch uniform monolayer molybdenum disulfide catalyzed by sodium in Glakss", Nature Communications, 9:979, 2018.

* cited by examiner

METHOD FOR PREPARING TRANSITION METAL CHALCOGENIDE FILM AND ORGANOMETALIC PROMOTER AND FORMING THE SAME

CROSS-REFERENCE TO RELATED APPLICATION

This application claims priority of Korean Patent Application No. 10-2022-0051290, filed on Apr. 26, 2022, in the KIPO (Korean Intellectual Property Office), the disclosure of which is incorporated herein entirely by reference.

BACKGROUND OF THE INVENTION

Field of the Invention

The present disclosure relates to a method for preparing a transition metal chalcogenide film and a promoter for the same, more particularly to a method for preparing a transition metal chalcogenide film, which can decrease the grain density of a transition metal chalcogenide without using solid powder, etc., and a promoter for the same.

Description of the Related Art

A grain boundary is formed at the interface between two grains of a material. Because the grain boundary functions as a scattering factor which hinders the movement of electrons, it worsens the electrical and optical properties of devices or the mechanical property of materials. Therefore, it is important to decrease the density of the grain boundary in a material.

For transition metal chalcogenides which are recognized as new materials for electronic devices such as semiconductors, a method of adding a promoter in the form of solid powder during the growth of the transition metal chalcogenide is being researched a lot to reduce the grain boundary density.

However, because solid powder precursors have low vapor pressure, the precursor should be located inside a chamber of high temperature for evaporation, and this results in the following problems.

1) It is difficult to control the temperatures of the chamber and the precursor independently.
2) The amount of the solid powder changes continuously with time. It is difficult to ensure reproducibility because the amount of the evaporated precursor changes depending on time and the amount of the remaining powder.
3) The concentration gradient of the precursor is large depending on the location on the substrate.
4) It is difficult to precisely control the amount of the solid powder precursor (The surface area, etc. of the powder are changed).

Accordingly, a new technology that can reduce the grain size of the transition metal chalcogenide film without using solid powder is necessary.

SUMMARY OF THE INVENTION

The present disclosure is directed to providing a new method for preparing a transition metal chalcogenide film, which can decrease the grain density of a transition metal chalcogenide, and application thereof.

The present disclosure provides a method for preparing a transition metal chalcogenide film, which includes: a step of injecting a precursor for preparing a transition metal chalcogenide and an organometallic promoter into a chamber equipped with a substrate; and a step of forming a transition metal chalcogenide film on the substrate through a chemical reaction between the precursor for preparing a transition metal chalcogenide and the organometallic promoter.

In an exemplary embodiment of the present disclosure, the organometallic promoter is sodium propionate and oxygen is injected together with the organometallic promoter into the chamber at the same time.

In an exemplary embodiment of the present disclosure, the organometallic promoter is pyrolyzed in the chamber. The organometallic promoter is pyrolyzed at a temperature lower than the growth temperature of the transition metal chalcogenide film.

In an exemplary embodiment of the present disclosure, the pyrolyzed organometallic promoter reacts with the precursor for preparing a transition metal chalcogenide, and the grain size or density of the transition metal chalcogenide film is determined by the flow rate of the organometallic promoter and the oxygen.

The present disclosure also provides an organometallic promoter for preparing a transition metal chalcogenide film, wherein the organometallic promoter is sodium propionate.

The present disclosure also provides a transition metal chalcogenide film prepared by the method described above.

In an exemplary embodiment of the present disclosure, the transition metal chalcogenide film includes a transition metal chalcogenide film formed from an intermediate formed from a chemical reaction between an organometallic promoter and the metal of the transition metal chalcogenide film.

In an exemplary embodiment of the present disclosure, the transition metal chalcogenide film is substantially carbon-free.

The grain size or density of the transition metal chalcogenide film is determined by the amount of the formed intermediate.

The present disclosure also provides a semiconductor device including the transition metal chalcogenide film.

According to the present disclosure, the grain density of a transition metal chalcogenide is decreased by injecting an organometallic promoter from outside of a chamber instead of evaporating a solid powder promoter inside a chamber. Through this, a transition metal chalcogenide film with improved electrical and optical properties can be achieved.

BRIEF DESCRIPTION OF THE DRAWINGS

The above and other features and advantages will become more apparent to those of ordinary skill in the art by describing in detail exemplary embodiments with reference to the attached drawings, in which.

In the following description, the same or similar elements are labeled with the same or similar reference numbers.

DETAILED DESCRIPTION

Figure 1:
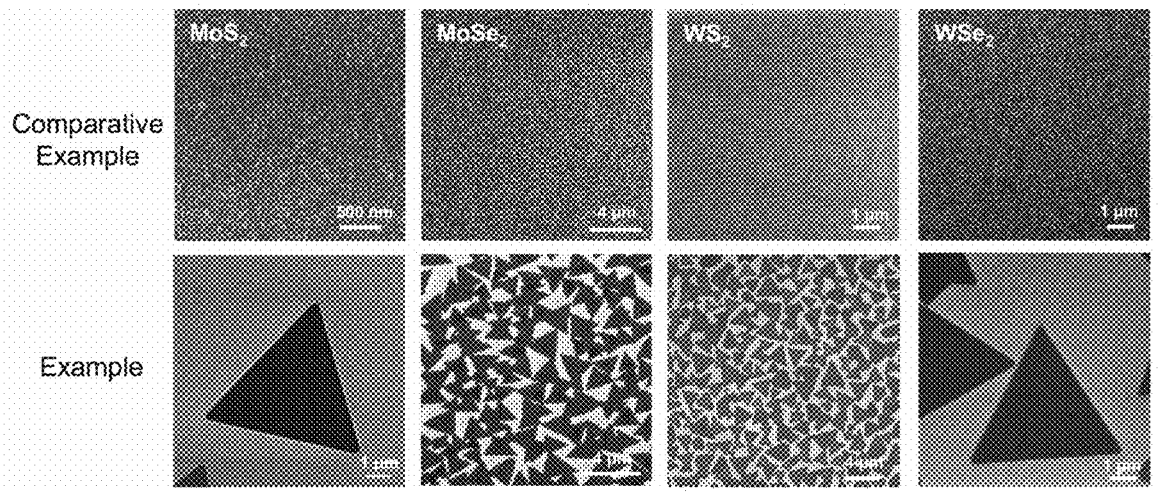
FIG. 1 shows the SEM images of four transition metal chalcogenide films prepared in Example and Comparative Example.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes", "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In addition, a term such as a "unit", a "module", a "block" or like, when used in the specification, represents a unit that processes at least one function or operation, and the unit or the like may be implemented by hardware or software or a combination of hardware and software.

Reference herein to a layer formed "on" a substrate or other layer refers to a layer formed directly on top of the substrate or other layer or to an intermediate layer or intermediate layers formed on the substrate or other layer. It will also be understood by those skilled in the art that structures or shapes that are "adjacent" to other structures or shapes may have portions that overlap or are disposed below the adjacent features.

In this specification, the relative terms, such as "below", "above", "upper", "lower", "horizontal", and "vertical", may be used to describe the relationship of one component, layer, or region to another component, layer, or region, as shown in the accompanying drawings. It is to be understood that these terms are intended to encompass not only the directions indicated in the figures, but also the other directions of the elements.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Preferred embodiments will now be described more fully hereinafter with reference to the accompanying drawings. However, they may be embodied in different forms and should not be construed as limited to the embodiments set forth herein. Rather, these embodiments are provided so that this disclosure will be thorough and complete, and will fully convey the scope of the disclosure to those skilled in the art.

In the present disclosure, a new promoter formed from a MOCVD (metal organic chemical vapor deposition) process is used. In an exemplary embodiment of the present disclosure, the promoter is sodium propionate (SP) having the following structural formula.

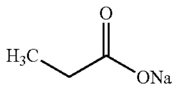

The sodium propionate used as a promoter in an exemplary embodiment of the present disclosure can be supplied from outside of a chamber because it has high vapor pressure, and can be grown because it has a decomposition temperature (450° C.) lower than the growth temperature (600° C.) of a transition metal chalcogenide. In addition, it is advantageous in that it is nontoxic and unharmful because the byproducts produced from chemical reactions are highly volatile and removed easily.

Hereinafter, the present disclosure is described more specifically through Example and Test Example.

EXAMPLE

Four high-quality transition metal chalcogenide films were synthesized by MOCVD according to the following conditions and methods. As transition metal precursors, $Mo(CO)_6$ and $W(CO)_6$ were used. As chalcogen precursors, $(C_2H_5)_2S$ and $(CH_3)_2Se$ were used. SP was used as an organometallic promoter and Ar was used as a carrier gas. In addition, $O_2$ and $H_2$ were injected together.

The flow rate of the precursors was controlled with a mass flow controller (MFC) in a bubbler system. The transition metal precursors were heated to 60° C. and the pressure of all the precursors was maintained at 800 Torr. The growth condition was $Mo(CO)_6$ 1.2 sccm, $W(CO)_6$ 3.5 sccm, $(C_2H_5)_2S$ 0.4 sccm, $(CH_3)_2Se$ 0.5 sccm, SP0.2 sccm, $O_2$ 0.1 sccm, and $H_2$ 10 sccm. $MoS_2$ and $MoSe_2$ were synthesized with Ar 400 sccm and a chamber pressure of 1.6 torr, and $WS_2$ and $WSe_2$ were grown with Ar 600 sccm and a chamber pressure of 2.7 torr. The synthesis chamber was heated to 600° C. for 50 minutes under the atmosphere of Ar 10 sccm and $H_2$ 10 sccm, and then a transition metal chalcogenide film was synthesized for 4 hours while injecting the transition metal precursor, the chalcogen precursor, SP, $O_2$ and $H_2$ simultaneously into the chamber at 600° C. After the synthesis, the synthesis chamber was cooled slowly to room temperature for 1 hour.

Comparative Example

Transition metal chalcogenide films were synthesized in the same manner as Example except that SP and $O_2$ were not used.

Test Example

Analysis of Grain Size

Figure 2:
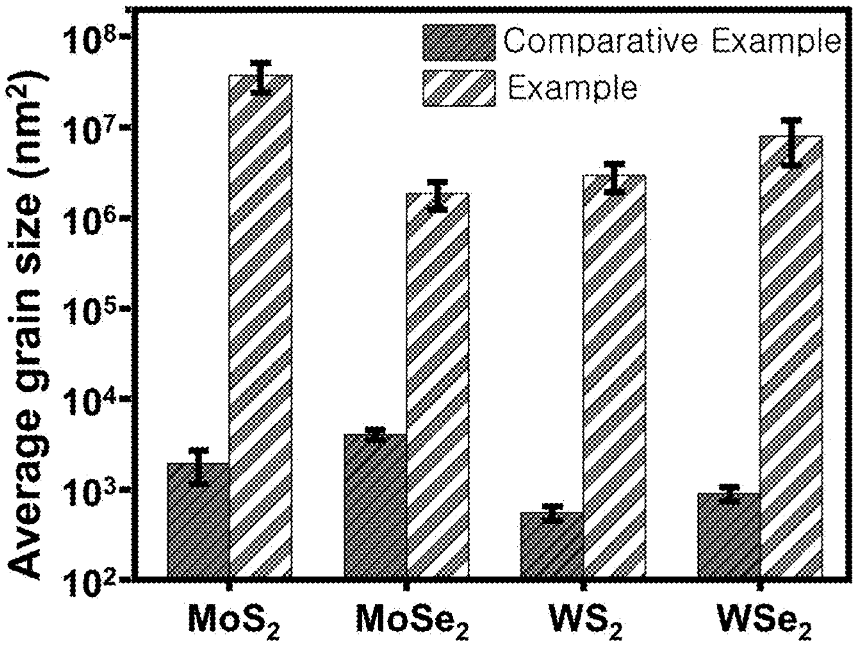
FIG. 2 shows the average grain size of four transition metal chalcogenide films prepared in Example and Comparative Example.

FIG. 1 shows the SEM images of the four transition metal chalcogenide films prepared in Example and Comparative Example, and FIG. 2 shows the average grain size thereof.

Referring to FIGS. 1 and 2, it can be seen that the grain size is increased for Example wherein the organometallic promoter according to the present disclosure was used and, as a result, the density defined by the number of grains per unit area is decreased. All the four transition metal chalcogenide films showed decreased density.

Analysis of Photoluminescent Properties

Figure 3:
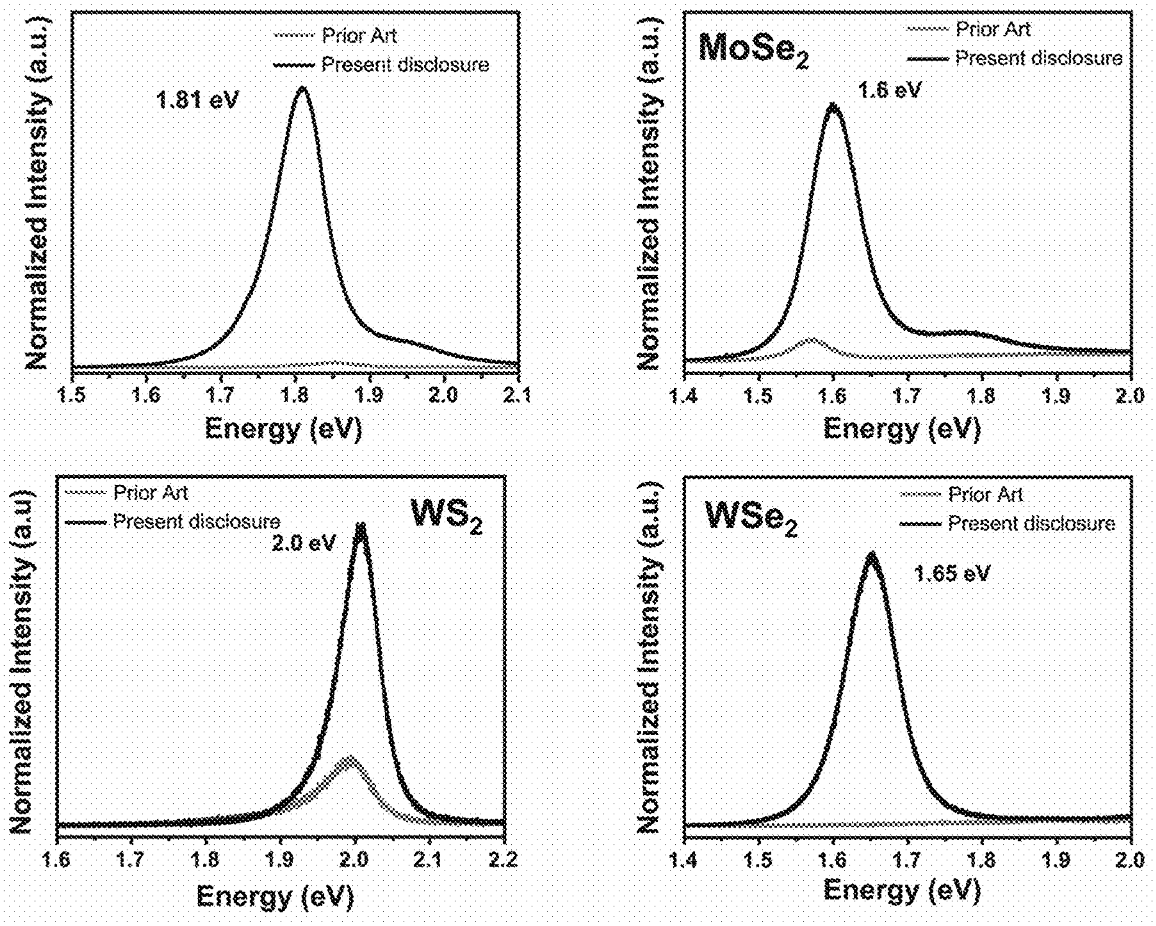
FIG. 3 shows a result of analyzing the photoluminescent properties of four transition metal chalcogenide films.

FIG. 3 shows a result of analyzing the photoluminescent properties of the four transition metal chalcogenide films.

The photoluminescent properties were identified by photoluminescence (PL) spectroscopy. The films of Example exhibited much stronger photoluminescence intensity as compared to those of Comparative Example, suggesting that high-quality films with less defects were prepared in Example.

Referring to FIG. 3, it can be seen that the films of Example (red curves) exhibit improved photoluminescent properties.

Analysis of Uniformity

The uniformity of a $MoS_2$ film deposited on a 2 cm×2 cm substrate was measured.

Figure 4:
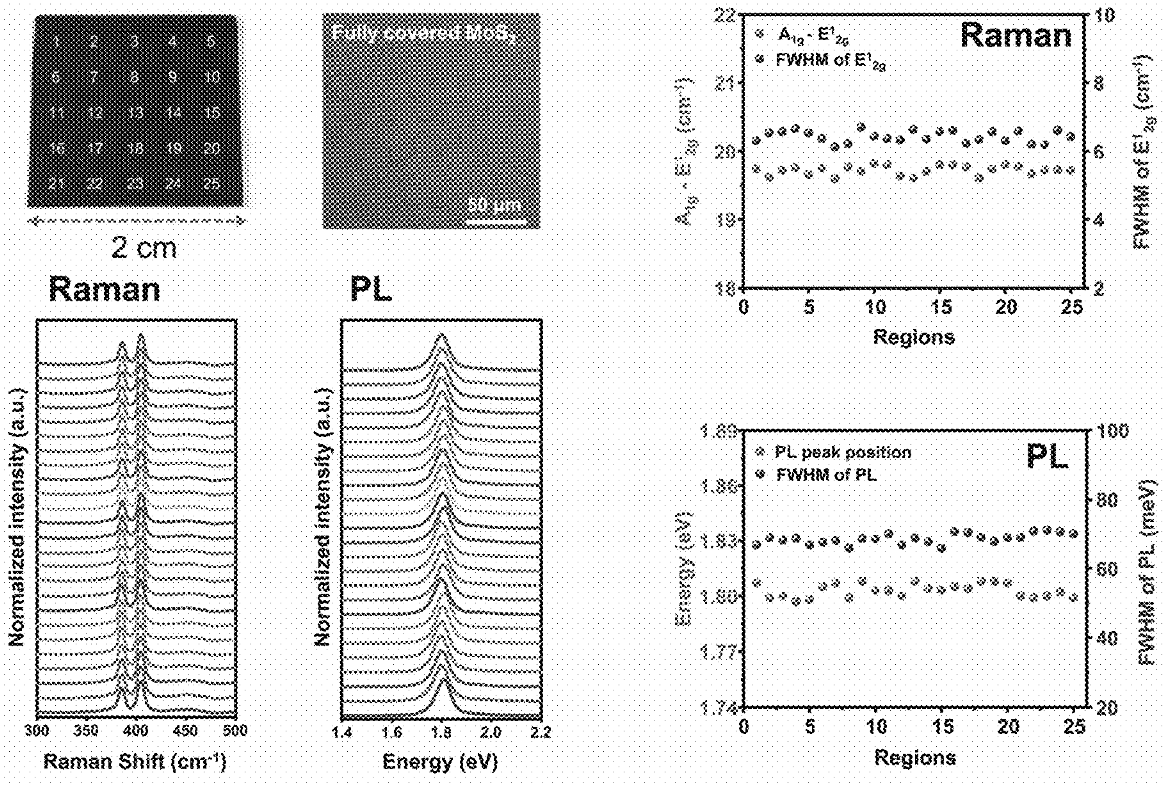
FIG. 4 shows a Raman spectroscopy analysis result and a PL analysis result.

FIG. 4 shows a Raman spectroscopy analysis result and a PL analysis result.

In FIG. 4, a) shows the image of a $MoS_2$ film grown on a 2 cm×2 cm $SiO_2$/Si (300 nm) substrate; b) shows the SEM image of a $MoS_2$ monolayer film grown by GAA-MOCVD; c) and d) show the normalized Raman (c) and PL (d) spectra of the $MoS_2$ film obtained at 25 different positions in a); e) shows the frequency difference between Raman $E^1_{2g}$ and $A_{1g}$ peaks and the FWHM of the Raman $E^1_{2g}$ peak determined from the Raman spectra of c); and f) shows the PL peaks and FWHM determined from the PL spectra of d).

Referring to FIG. 4, it can be seen that transition metal chalcogenide films could be grown with large sizes by using the promoter according to the present disclosure. It was confirmed that the $MoS_2$ thin films grown on the 2 cm×2 cm $SiO_2$/Si substrate have uniformity because they exhibit uniform optical (Raman and PL) properties. The uniform color contrast of the optical image indicates the spatial uniformity of the $MoS_2$ monolayer film (FIG. 4*a*).

In FIG. 4*b*, the dark line in the SEM image of the $MoS_2$ monolayer film grown by injecting the promoter and oxygen according to the present disclosure indicates the $MoS_2$ grown excessively at the interface between $MoS_2$ grains. Since thin film growth must be optimized along with grain-to-grain connections, increasing the grain size in 2D $MoS_2$ film growth by controlling nucleation is more challenging than in the case of flake growth. However, the grain size of the 2D $MoS_2$ film of the present disclosure was ~30 μm, which is larger than that of the fully covered 2D film produced by MOCVD.

The normalized Raman and PL spectra of the 25 positions of the $MoS_2$ film formed according to the present disclosure shown in FIG. 4*a* are shown in FIGS. 4*c* and 4*d*, respectively. The Raman and PL spectra of $MoS_2$ were normalized according to the intensity of the Raman $A_{1g}$ peak and PL A-exciton peak.

The spectra obtained from all the 25 positions were nearly identical with each other for both Raman and PL.

The statistical results for the Raman and PL spectra obtained from the 25 positions are shown in FIGS. 4*e* and 4*f*.

Referring to FIGS. 4*e* and 4*f*, the average frequency difference was 19.71 $cm^{-1}$ for $MoS_2$ monolayer, with a standard deviation of 0.067 $cm^{-1}$, which is consistent with the reported monolayer $MoS_2$ Raman spectra (see A. Molina-Sanchez, L. Wirtz, *Phys. Rev. B* 2011, 84, 155413; C. Lee, H. Yan, L. E. Brus, T. F. Heinz, J. Hone, S. Ryu, *ACS Nano* 2010, 4, 2695.; Y. Zhao, X. Luo, H. Li, J. Zhang, P. T. Araujo, C. K. Gan, J. Wu, H. Zhang, S. Y. Quek, M. S. Dresselhaus, Q. Xiong, *Nano Lett.* 2013, 13, 1007). In addition, the average FWHM of the Raman $E^1_{2g}$ peak was 6.43 $cm^{-1}$, with a standard deviation of 0.166 $cm^{-1}$, which is similar to that of exfoliated $MoS_2$ monolayers (J. Zhang, H. Yu, W. Chen, X. Tian, D. Liu, M. Cheng, G. Xie, W. Yang, R. Yang, X. Bai, D. Shi, G. Zhang, ACS Nano 2014, 8, 6024.).

These results strongly suggest that a uniform thin film can be grown on a substrate with a large size using the promoter according to the present disclosure.

Decrease of Grain Density

It was investigated whether grain density can be controlled with the amount of sodium propionate, which is a promoter of the present disclosure, and oxygen.

Figure 5:
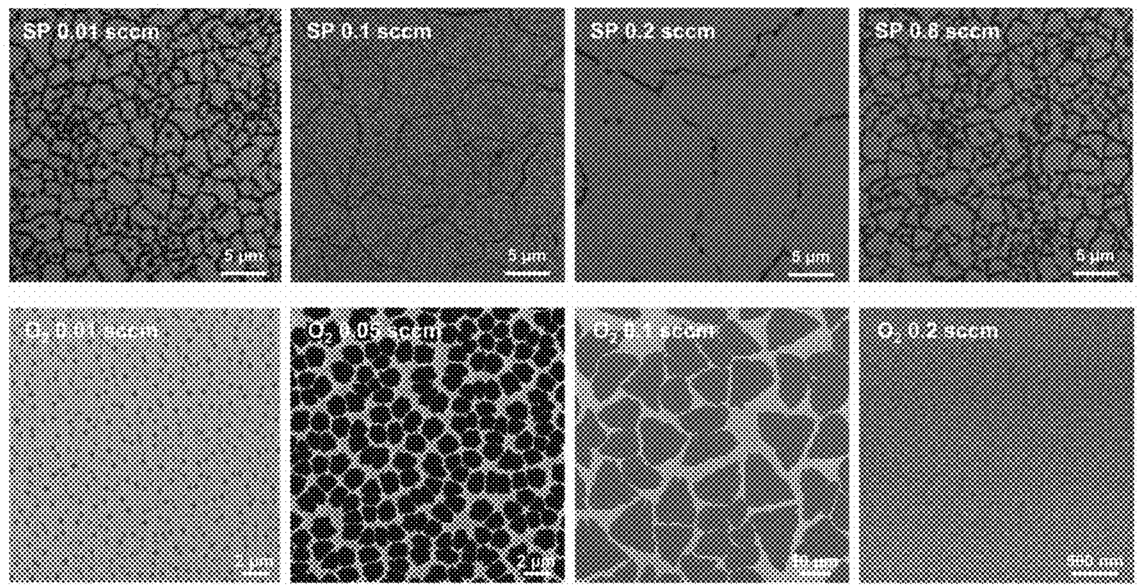
FIG. 5 shows the SEM images of thin films formed by controlling the amount of a promoter (SP) and $O_2$.
Figure 6:
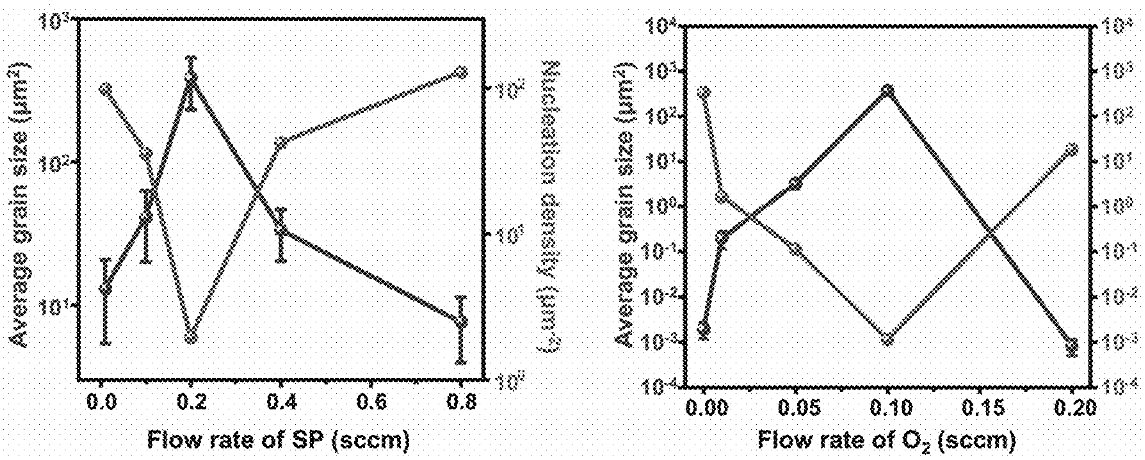
FIG. 6 shows the average grain size measured while varying the supply amount of SP and $O_2$.

FIG. 5 shows the SEM images of thin films formed by controlling the amount of a promoter (SP) and $O_2$, and FIG. 6 shows the average grain size measured while varying the supply amount of SP and $O_2$.

FIG. 5*a* shows the SEM images of the monolayer $MoS_2$ films grown with varying SP flow rates and a constant oxygen flow rate. When the SP flow rate was increased in the range of 0.01-0.2 sccm, the average grain size and nucleation density of $MoS_2$ increased and decreased, respectively. At 0.2 sccm of SP, the $MoS_2$ exhibited the largest grain size and the lowest nucleation density. When the SP flow rate was increased in the range of 0.2-0.8 sccm, the average grain size and nucleation density of $MoS_2$ decreased and increased, respectively.

FIG. 5*b* shows the SEM images of the monolayer $MoS_2$ films grown with varying oxygen flow rates and a constant SP flow rate. Similarly, when the oxygen flow rate was increased in the range of 0.01-0.1 sccm, the average grain size and nucleation density of $MoS_2$ increased and decreased, respectively. At 0.1 sccm of oxygen, the $MoS_2$ exhibited the largest grain size and the lowest nucleation density. When the oxygen flow rate was increased in the range of 0.1-0.2 sccm, the average grain size and nucleation density of $MoS_2$ decreased and increased, respectively.

The average grain size and nucleation density of $MoS_2$ as functions of SP and oxygen flow rates are shown in FIG. 6. Referring to FIG. 6, the maximization of $MoS_2$ grain size required optimum SP and oxygen flow rates. Up to an SP flow rate of 0.2 sccm and an oxygen flow rate of 0.1 sccm, the grain size and nucleation density of $MoS_2$ increased and decreased, respectively, with increasing SP and oxygen flow rates.

These results show that the grain size and density can be controlled effectively by controlling the amount of sodium propionate, which is the promoter according to the present disclosure, and oxygen.

Figure 7:
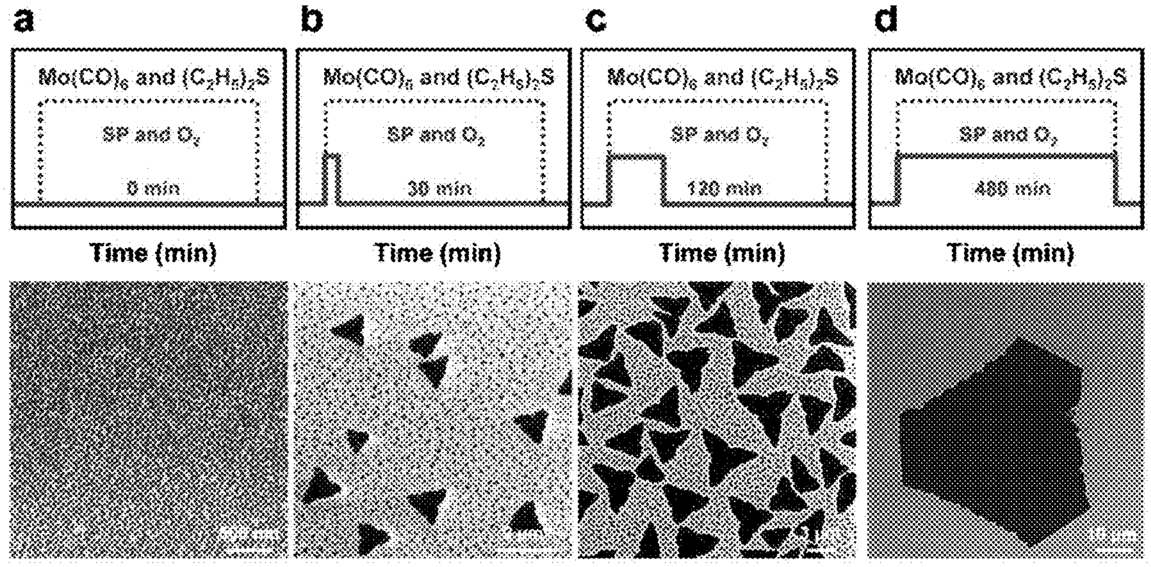
FIG. 7 shows growth behavior depending on the injection time of SP and oxygen.

FIG. 7 shows growth behavior depending on the injection time of SP and oxygen.

FIG. 7 schematically illustrates different growth conditions and corresponding SEM images of $MoS_2$. Injection time of SP and oxygen of a) 0 minute, b) 30 minutes, c) 120 minutes and d) 480 minutes.

Referring to FIG. 7, it can be seen that, without SP and oxygen, the grain size ranged from 40 to 50 nm due to the high nucleation density (FIG. 7*a*). However, the grain size increased when SP and oxygen were injected throughout the growth process (FIG. 7*d*). In particular, when the supply of SP and oxygen was stopped in the middle of the growth process, there was a mixture of large- and small-grained $MoS_2$ flakes (FIG. 7*b*, *c*), indicating that large grains were initially grown in a state in which nucleation was suppressed, and small grains were grown later in a state in which nucleation was not suppressed and a film was grown therefrom.

In the existing MOCVD where SP and $O_2$ are not used, $MoS_2$ is synthesized through chemical reactions between precursors, e.g., $Mo(CO)_6$ and $(C_2H_5)_2S$, constituting a transition metal dichalcogenide film. Therefore, low-quality $MoS_2$ with high grain density is synthesized due to low reactivity and diffusivity of $Mo(CO)_6$.

However, in the present disclosure where the organometallic promoter SP and $O_2$ are used, intermediate compounds with good reactivity and diffusivity are formed through chemical reaction of SP, $O_2$ and $Mo(CO)_6$, and high-quality $MoS_2$ with low grain density is synthesized through chemical reaction of these intermediate compounds and $(C_2H_5)_2S$. Because the amount of the intermediate compounds is determined by the flow rates of SP and $O_2$, the grain density and size can be controlled effectively by controlling the flow rates of SP and $O_2$.

Analysis of Intermediate Compounds

Figure 8:
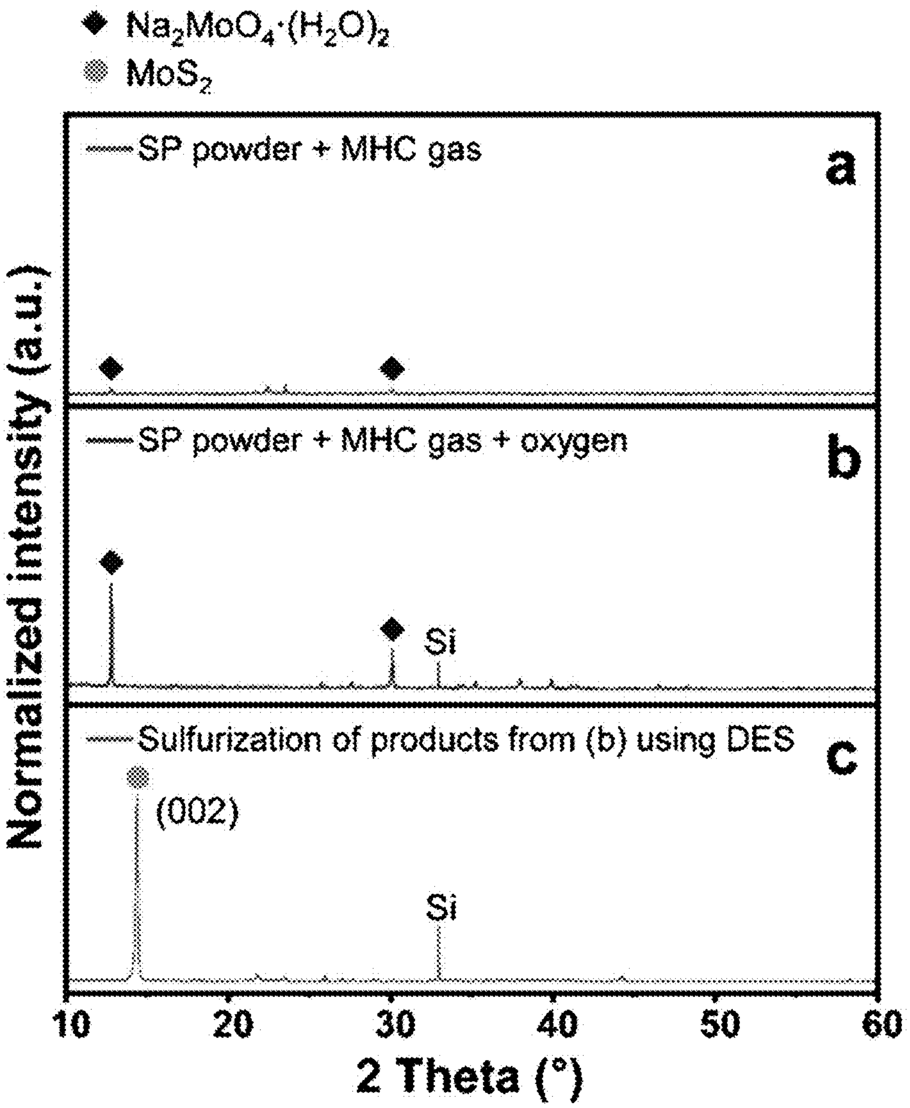
FIG. 8 shows the XRD patterns of reaction products depending on combinations of precursors.

FIG. 8 shows the XRD patterns of reaction products depending on combinations of precursors. a) SP powder+MHC gas; b) SP powder+MHC gas+oxygen; c) sulfurization of products from (b) using DES gas.

Referring to FIG. 8, in both (a) and (b), the XRD peaks of $Na_2MoO_4$ were detected, suggesting that $\gamma$-$Na_2CO_3$ reacted with $Mo(CO)_6$ to form the intermediate $Na_2MoO_4$. However, the intensity of the normalized XRD peaks of $Na_2MoO_4$ in (b) was approximately 20 times higher than that of (a) despite the similar FWHM in both cases, indicating an increase in the concentration of $Na_2MoO_4$ in (b). In (c), all the XRD peaks of $Na_2MoO_4$ disappeared, while a strong (002) peak of $MoS_2$ was newly detected, suggesting that $Na_2MoO_4$ acted as a metal source in the growth of $MoS_2$.

Analysis of Electrical Property

The improved electrical property of the thin film with a decreased grain density using the promoter according to the present disclosure (present disclosure) was analyzed by investigating mobility and on/off ratio.

Figure 9:
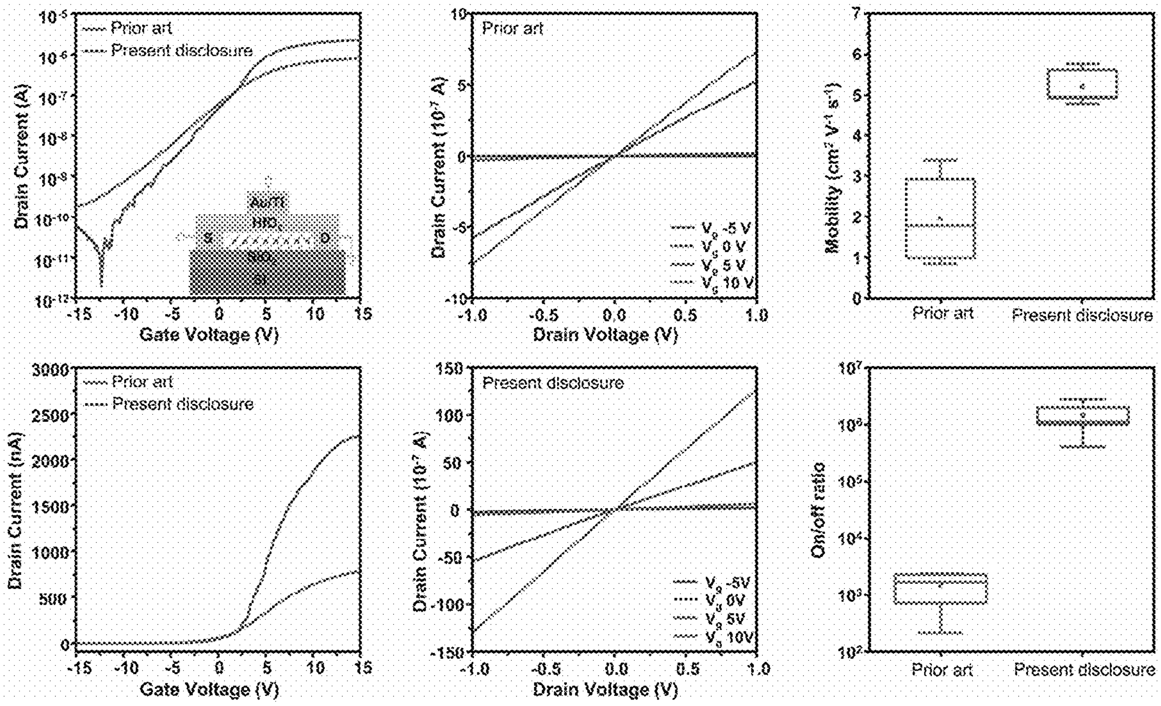
FIG. 9 shows a result of analyzing the electrical property of transition metal chalcogenide thin films.

FIG. 9 shows a result of analyzing the electrical property of the transition metal chalcogenide thin films.

In FIG. 9, the electrical property of top-gated devices fabricated with $MoS_2$ grown by C-MOCVD according to Comparative Example or GAA-MOCVD according to Example was analyzed. Referring to FIG. 9, it can be seen that the mobility and on/off ratio of the thin film prepared according to the present disclosure were improved by 3 times and 1000 times, respectively, as compared to the film prepared by the existing method.

The C-MOCVD-grown $MoS_2$ device of Comparative Example showed low carrier mobility (2.4 $cm^2\ V^{-1}\ s^{-1}$) and a low on/off ratio ($2.4\times10^3$), suggesting poor film quality and electrical properties due to scattering at the grain boundary. In contrast, the $MoS_2$ device grown by GAA-MOCVD using the promoter according to the present disclosure exhibited higher mobility (5.8 $cm^2\ V^{-1}\ s^{-1}$) and a higher on/off ratio ($1.1\times10^6$), indicating reduced grain boundary scattering due to the larger grain size. This suggests that the $MoS_2$ film prepared according to the present disclosure has a lower defect concentration and higher film quality than that prepared according to the prior art.

The output curves of the $MoS_2$ top-gated FETs grown by C-MOCVD according to Comparative Example and by GAA-MOCVD according to Example are shown in FIGS. 9*c* and 9*d*, and their statistics of mobility and on/off ratio are shown in FIGS. 9*e* and 9*f*, respectively.

Referring to FIG. 9, the average mobilities of $MoS_2$ FETs grown by C-MOCVD and GAA-MOCVD were 1.9 and 5.2 $cm^2\ V^{-1}\ s^{-1}$, respectively, and the average on/off ratios were $1.5\times10^3$ and $1.5\times10^6$, respectively. The GAA-MOCVD-grown $MoS_2$ of Example exhibited smaller deviations in mobility and on/off ratio as compared to the C-MOCVD-grown $MoS_2$ of Comparative Example. That is to say, the GAA-MOCVD-grown $MoS_2$ according to the present disclosure exhibited better mobility and on/off ratio than the C-MOCVD-grown $MoS_2$ due to the larger grain size.

These results suggest that the grain density or size of the transition metal chalcogenide can be controlled by using the organometallic promoter according to the present disclosure and, through this, it is possible to obtain a transition metal chalcogenide film with improved electrical and optical properties.

Use of Various Substrates

Figure 10:
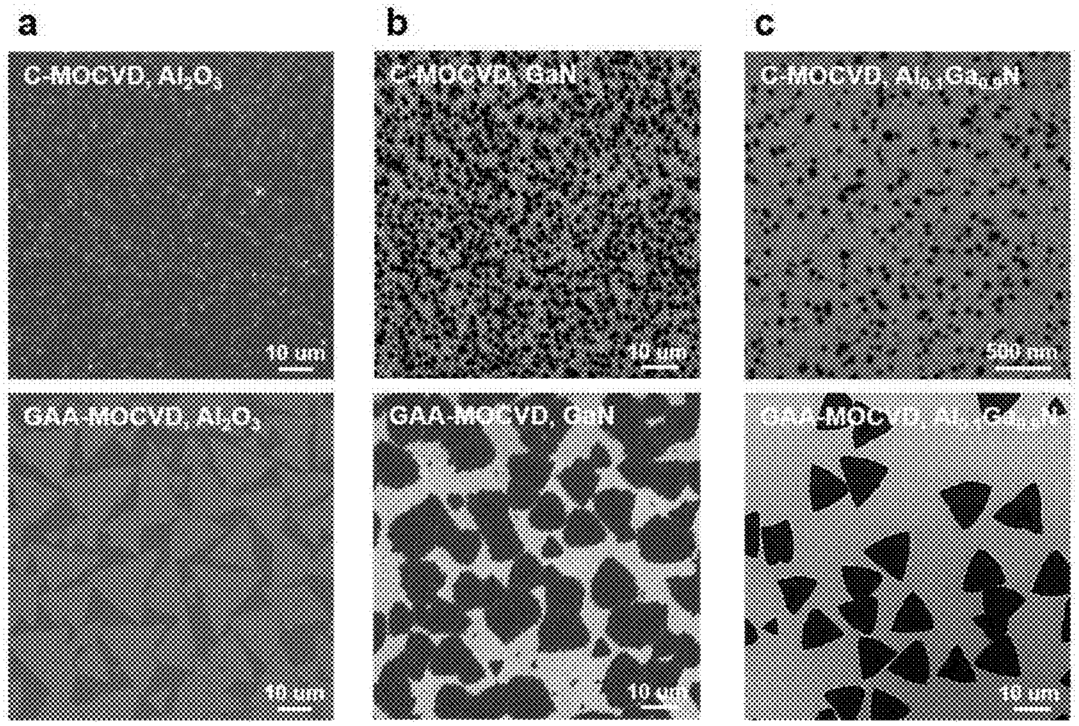
FIG. 10 shows the SEM images of $MoS_2$ synthesized on $Al_2O_3$, GaN and $Al_{0.1}Ga_{0.9}N$.

FIG. 10 shows the SEM images of $MoS_2$ synthesized on $Al_2O_3$, GaN and $Al_{0.1}Ga_{0.9}N$.

Referring to FIG. 10, it can be seen that the $MoS_2$ synthesized on all of $Al_2O_3$, GaN and $Al_{0.1}Ga_{0.9}N$ by GAA-MOCVD according to Example exhibited larger grain size and smaller grain density as compared to the $MoS_2$ synthesized by C-MOCVD according to Comparative Example.

Residual Carbon

It was investigated by X-ray photoelectron spectroscopy (XPS) and Raman spectroscopy whether carbon remains in the $MoS_2$ thin film synthesized using the organometallic promote. The carbon remaining in the thin film worsens the electrical property of the material and increases nucleation density by acting as nucleation seeds during the thin film growth, leading to a smaller grain size and decreased crystallinity. Accordingly, it is important to minimize residual carbon.

Figure 11:
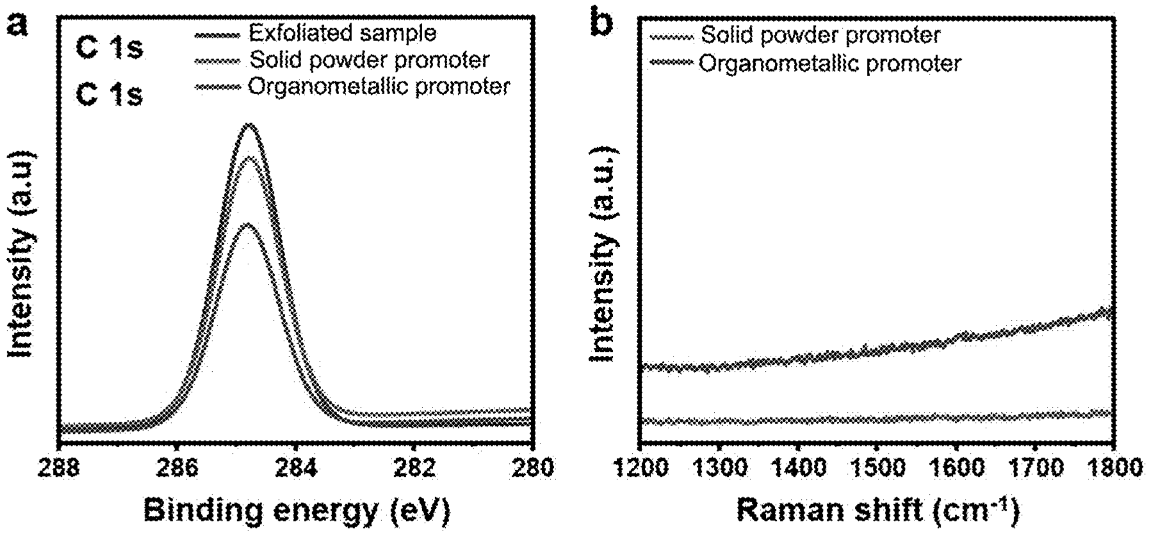
FIG. 11 shows an XPS analysis result and a Raman spectroscopy analysis result.

FIG. 11 shows an XPS analysis result and a Raman spectroscopy analysis result.

FIG. 11*a* shows the XPS analysis result for the synthesized $MoS_2$ thin film. It can be seen that the amount of residual carbon is smaller for Example wherein the organometallic promoter according to the present disclosure was used as compared to an exfoliated sample or a $MoS_2$ sample synthesized using a solid powder promoter.

FIG. 11*b* shows the Raman spectroscopy analysis result for the synthesized $MoS_2$ thin film. It can be seen that no carbon peak appeared in Example wherein the organometallic promoter according to the present disclosure was used as the $MoS_2$ sample synthesized using a solid powder promoter.

This result indicates that a high-quality $MoS_2$ thin film with substantially no residual carbon can be synthesized using sodium propionate as the organometallic promoter according to the present disclosure.

While the present disclosure has been described with reference to the embodiments illustrated in the figures, the embodiments are merely examples, and it will be understood by those skilled in the art that various changes in form and other embodiments equivalent thereto can be performed. Therefore, the technical scope of the disclosure is defined by the technical idea of the appended claims The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A method for preparing a transition metal chalcogenide film, comprising:

injecting a precursor for preparing a transition metal chalcogenide and an organometallic promoter into a chamber equipped with a substrate from outside the chamber; and forming the transition metal chalcogenide film on the substrate through a chemical reaction between the precursor for preparing the transition metal chalcogenide and the organometallic promoter in the chamber, wherein, prior to injecting the precursor, the chamber is controlled to maintain a temperature higher than a decomposition temperature of the precursor for preparing the transition metal chalcogenide and the organometallic promoter, thereby causing the injected precursor for preparing the transition metal chalcogenide and the organometallic promoter to decompose in a gas phase and react with each other within the chamber.

2. The method for preparing the transition metal chalcogenide film of claim 1, wherein the organometallic promoter is an alkali metal organic compound, and the organometallic promoter is decomposed at a temperature lower than a formation temperature of the transition metal chalcogenide film.

3. The method for preparing the transition metal chalcogenide film of claim 2, wherein oxygen is injected together with the organometallic promoter into the chamber at the same time.

4. The method for preparing the transition metal chalcogenide film of claim 1, wherein the organometallic promoter is pyrolyzed in the chamber.

5. The method for preparing the transition metal chalcogenide film of claim 4, wherein the organometallic promoter is pyrolyzed at a temperature lower than a growth temperature of the transition metal chalcogenide film.

6. The method for preparing the transition metal chalcogenide film of claim 4, wherein the pyrolyzed organometallic promoter reacts with the precursor for preparing the transition metal chalcogenide.

7. The method for preparing the transition metal chalcogenide film of claim 3, wherein the grain size or density of the transition metal chalcogenide film is determined by a flow rate of the organometallic promoter and the oxygen.

8. The transition metal chalcogenide film prepared by the method of claim 1.

9. The transition metal chalcogenide film of claim 8, wherein the transition metal chalcogenide film comprises the transition metal chalcogenide film formed from an intermediate formed from the chemical reaction between the organometallic promoter and a metal of the transition metal chalcogenide film.

10. The transition metal chalcogenide film of claim 9, wherein a grain size or density of the transition metal chalcogenide film is determined by an amount of the formed intermediate.

11. The transition metal chalcogenide film of claim 8, wherein the transition metal chalcogenide film is carbon-free.

12. The method for preparing the transition metal chalcogenide film of claim 2, wherein the organometallic promoter is a sodium propionate.

13. An organometallic promoter for preparing a transition metal chalcogenide film, wherein the organometallic promoter is an alkali metal organic compound and the alkali metal organic compound is decomposed at a temperature lower than a formation temperature of the transition metal chalcogenide film.

14. The organometallic promoter for preparing a transition metal chalcogenide film of claim 13, wherein the alkali metal organic compound is a sodium propionate.

* * * * *